United States Patent
Zhou et al.

(10) Patent No.: US 9,134,628 B2
(45) Date of Patent: Sep. 15, 2015

(54) OVERLAY MARK AND APPLICATION THEREOF

(75) Inventors: Jianming Zhou, Boise, ID (US); Craig Hickman, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 68 days.

(21) Appl. No.: 13/349,576

(22) Filed: Jan. 13, 2012

(65) Prior Publication Data

US 2013/0182255 A1    Jul. 18, 2013

(51) Int. Cl.
*G01B 11/00* (2006.01)
*G03F 7/20* (2006.01)

(52) U.S. Cl.
CPC .................. *G03F 7/70633* (2013.01)

(58) Field of Classification Search
CPC .................................... G03F 7/70633
USPC ........................................ 356/401
See application file for complete search history.

(56) References Cited

U.S. PATENT DOCUMENTS

| 5,731,877 | A | * | 3/1998 | Ausschnitt | 356/620 |
| 2005/0048741 | A1 | * | 3/2005 | Phan et al. | 438/462 |
| 2005/0122516 | A1 | * | 6/2005 | Sezginer et al. | 356/401 |
| 2009/0279091 | A1 | * | 11/2009 | Levinski et al. | 356/399 |

* cited by examiner

*Primary Examiner* — Tarifur Chowdhury
*Assistant Examiner* — Omar Nixon
(74) *Attorney, Agent, or Firm* — Jianq Chyun IP Office

(57) ABSTRACT

An overlay mark for checking alignment accuracy between a former layer and a later layer on a wafer is described, including a former pattern as a part of the former layer, and a later pattern as a part of a patterned photoresist layer defining the later layer. The former pattern has two parallel opposite edges each forming a sharp angle α with the x-axis of the wafer. The later pattern also has two parallel opposite edges each forming the sharp angle α with the x-axis of the wafer.

2 Claims, 1 Drawing Sheet

OVERLAY MARK AND APPLICATION THEREOF

BACKGROUND OF THE INVENTION

1. Field of Invention

This invention relates to integrated circuit (IC) fabrication, and particularly to an overlay mark for checking the alignment accuracy between a former layer and a later layer on a wafer, and a method of checking alignment accuracy with the overlay mark.

2. Description of Related Art

Overlay marks are generally formed on a wafer to check the alignment accuracy between a former layer and a later layer. Currently, the most popular type of overlay mark is the so-called box-in-box (BIB) overlay mark.

FIG. 1 shows a top view of a prior art BIB overlay mark together with patterns in a device region. The BIB overlay mark typically includes, in an overlay mark region 14 usually in the scribe line region (not shown) of a semiconductor wafer, a square-ring pattern 100b as a part of a former layer, and a box pattern 110b as a part of the patterned photoresist layer defining a later layer formed after the former layer is patterned. The pattern 100b is defined together with the pattern 100a of the former layer in the device region 12. The pattern 110b is defined together with the pattern 110a of the later layer in the device region 12, and is surrounded by the ring pattern 100b. It is expected that the x- and y-shifts of the box pattern 110b relative to the ring pattern 100b reflect the x- and y-directional overlay errors between the former layer 100a and the later layer 110a in the device region 12.

However, when the device patterns are not oriented in the x- or y-direction of the wafer, the conventional overlay mark does not have the same response as is the patterns in the device region and hence can no longer reflect the behaviors of the device features. A reason causing this problem is that the rotated patterns in combination with the illumination source induce various aberrations to which the device patterns and the above overlay mark have different responses. For example, as illustrated in FIG. 1, the box pattern 110b in the overlay mark region 14 may be shifted to the opposite direction in the x-axis direction in relation to the shifted pattern 110a of the later layer in the device region 12. The positional shift of the box pattern 110b in the x- or y-direction may be different from that of the pattern 110a in the device region 12 due to aberrations.

SUMMARY OF THE INVENTION

Accordingly, this invention provides an overlay mark for checking the alignment accuracy between a former layer and a later layer on a wafer, which accurately reflects the overlay error in the neighboring device region when the device patterns of the later layer are not oriented in the x- or y-direction.

This invention also provides a method of using the overlay mark to check the alignment accuracy between a former layer and a later layer on a wafer for any given pattern.

The overlay mark of this invention includes at least one former pattern as a part of the former layer, and at least one later pattern as a part of the patterned photoresist layer defining the later layer. An example of this pattern would be at least one former pattern which has two parallel opposite edges each forming a sharp angle α with the x-axis of the wafer. The at least one later pattern also has two parallel opposite edges each forming the sharp angle α with the x-axis of the wafer. Additional patterns with lines, contact holes or imaging could be used with this idea.

In an embodiment, at least one of the at least one former pattern and the at least one later pattern has a linear shape oriented in the sharp angle α.

The method of checking alignment accuracy of this invention includes the steps below. The above overlay mark is provided. Along the direction perpendicular to the two parallel opposite edges of the at least one later pattern, the shift ΔL of the at least one later pattern, from the predetermined position where the at least one later pattern would be if no overlay error is present, is then measured.

From the shift ΔL measured, it is possible to calculate the x-directional overlay error as ΔL·sin α and the y-directional overlay error as ΔL·cos α.

Because the overlay mark includes a former pattern and a later pattern both not oriented in the x- or y-direction of the wafer, it can more accurately reflects the overlay error of inclined patterns in the neighboring device region. The overlay mark is also applicable to a case where x- and y-directional patterns are present in the device region.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention. For example, although each pattern as a part of the former or later layer in the overlay mark has a linear shape in the following embodiments, any pattern in the overlay mark of this invention may alternatively have a short shape if only it has two parallel opposite sides each forming a sharp angle with the x-axis of the wafer.

Figure 1:
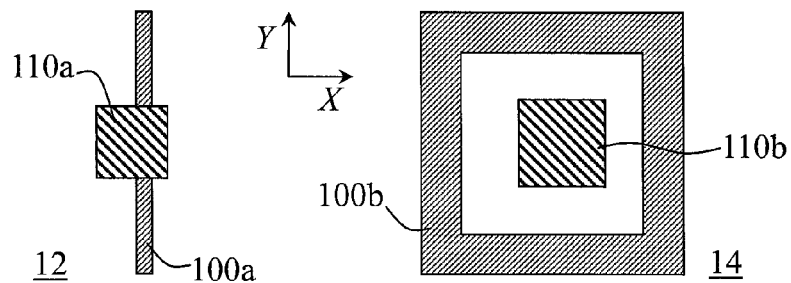
FIG. 1 illustrates a top view of a prior-art box-in-box (BIB) overlay mark together with patterns in a device region, and a case where the overlay mark does not accurately reflects the overlay error in the device region.
Figure 2A:
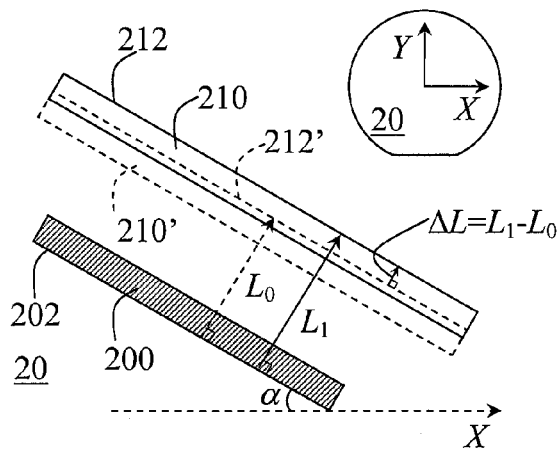
FIG. 2A illustrates a top view of an overlay mark and the principle of a method of using the same to check alignment accuracy, according to an embodiment of this invention.

FIG. 2A illustrates a top view of an overlay mark and the principle of a method of using the same to check alignment accuracy, according to an embodiment of this invention.

Referring to FIG. 2A, the overlay mark for checking the alignment accuracy between a former layer and a later layer, on a semiconductor wafer includes a former linear pattern 200 and a later linear pattern 210, wherein the later layer is formed after the former layer is patterned. Former linear pattern 200 is part of the former layer. Later linear pattern 210 is a part of a patterned photoresist layer defining the later layer. The former linear pattern 200 is oriented in a direction that forms a sharp angle α as to the x-axis of the wafer 20. The later linear pattern 210 is also oriented in the same direction.

The value of the sharp angle α is set according to the orientation of the desired patterns in the device region (not shown).

As the overlay mark is used to check the alignment accuracy between the former layer and the later layer, the linearly shifted distance, ΔL, of the later linear pattern 210 from a predetermined position, along the direction perpendicular to the orientation of the linear pattern 210, is determined. The predetermined position is the position where the later linear pattern 210' (shown in dashed line) would be if no overlay error is present.

The shifted distance, ΔL, may be determined by measuring the distance $L_1$ between the non-facing edges 202 and 212 of the former linear pattern 200 and the later linear pattern 210 and then subtract the predetermined distance $L_0$ from $L_1$, wherein the predetermined distance $L_0$ is the distance between the non-facing edges 202 and 212' of the former linear pattern 200 and the later linear pattern 210' when no overlay error is present. The distance $L_1$ may be measured by using a laser beam to scan along the direction perpendicular to the orientation of the linear pattern 200 or 210, determining the positions of the non-facing edges 202 and 212 of the former linear pattern 200 and the later linear pattern 210 from the variation of the reflection ratio and then calculating the difference between the positions of the non-facing edges 202 and 212 of the former linear pattern 200 and the later linear pattern 210.

Figure 2B:
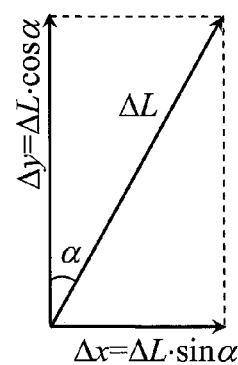
FIG. 2B illustrates the principle of the method of obtaining the x- and y-directional overlay errors from the determined shift ΔL of the overlay mark as shown in FIG. 2A.

After the shift ΔL of the later linear pattern 210 from the predetermined position is determined, it is possible to calculate the x-directional overlay error as ΔL·sin α and the y-directional overlay error as ΔL·cos α, as illustrated in FIG. 2B. Based on such determined x- and y-directional overlay errors of a plurality of the overlay marks of this invention disposed all over the wafer, the exposure optical system can be adjusted for a better overlay accuracy of the subsequent wafers.

Moreover, though the overlay mark in the above embodiment includes only one former pattern as a part of the former layer and only one later pattern as a part of the later layer, the overlay mark of this invention may alternatively include a plurality of former patterns, include a plurality of later patterns, or include a plurality of former patterns and a plurality of later patterns. For example, FIG. 3 illustrates the top view of an overlay mark according to another embodiment of this invention, which includes two former patterns and two later patterns.

Figure 3:
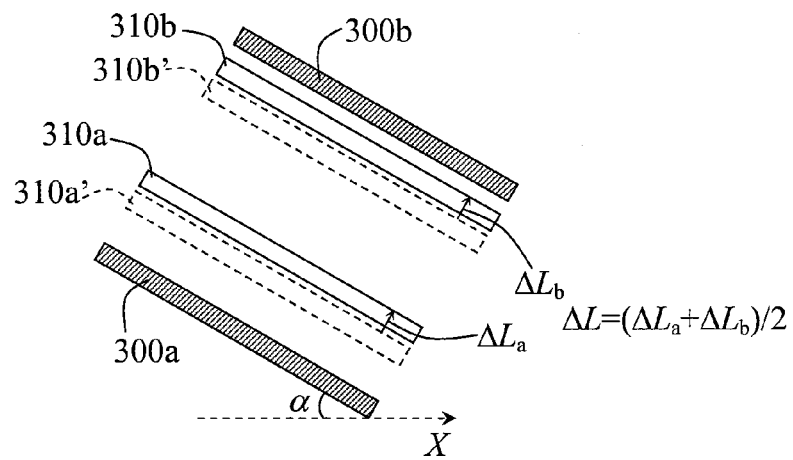
FIG. 3 illustrates a top view of an overlay mark according to an exemplary embodiment of this invention.

Referring to FIG. 3, the overlay mark includes two former linear patterns 300a and 300b and two later linear patterns 310a and 310b, each of which is oriented in the same direction forming a sharp angle α with the x-axis of the wafer 20 (FIG. 2). The former linear pattern 300a and the later linear pattern 310a are disposed in a pair. The former linear pattern 300b and the later linear pattern 310b are disposed in a pair. The two later linear patterns 310a and 310b are disposed between the two former linear patterns 300a and 300b.

To utilize the overlay mark to check the alignment accuracy between the former layer and the later layer, for example, the shift $\Delta L_a$ of the later linear pattern 310a from the predetermined position of the later linear pattern 310a' when no overlay error is present along the direction perpendicular to the orientation of the linear pattern 300a, 300b, 310a or 310b is determined, the shift $\Delta L_b$ of the later linear pattern 310b from the predetermined position of the later linear pattern 310b' when no overlay error is present along the perpendicular direction is determined, and then the overlay error ΔL is calculated as the average of $\Delta L_a$ and $\Delta L_b$.

Because the overlay mark includes a former linear pattern and a later linear pattern both not oriented in the x- or y-direction of the wafer, it can more accurately reflects the overlay error of inclined patterns in the neighboring device region.

Moreover, the overlay mark of this invention is also applicable to a case where x- and y-directional patterns are present in the device region. The x-directional overlay error and the y-directional overlay error can be determined as ΔL·sin α and ΔL·cos α, respectively, as mentioned above.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of checking alignment accuracy between a former layer and a later layer on a wafer, comprising:
    providing an overlay mark, the overlay mark comprises:
        at least one former pattern, as a part of the former layer, having two parallel opposite edges each forming a sharp angle α with an x-axis of the wafer; and
        at least one later pattern as a part of a patterned photoresist layer defining the later layer, having two parallel opposite edges each forming the sharp angle α with the x-axis of the wafer, wherein the at least one later pattern does not overlay the at least one former pattern, and the at least one later pattern and the at least one former pattern are parallel;
    determining, along a direction perpendicular to the parallel opposite edges of the at least one later pattern, a shift ΔL of the at least one later pattern from a predetermined position where the at least one later pattern would be if no overlay error is present; and
    calculating, from the shift ΔL, an x-directional overlay error as ΔL·sinα and a y-directional overlay error as ΔL·cosα,
    wherein the at least one former pattern comprises two former patterns that comprise a first pattern and a second pattern,
    the at least one later pattern comprises two later patterns that comprises a third pattern and a fourth pattern,
    the first pattern and the third pattern are disposed in a pair,
    the second pattern and the fourth pattern are disposed in a pair, and
    the third pattern and the fourth pattern are disposed between the first pattern and the second pattern.

2. The method of claim 1, wherein at least one of the at least one former pattern and the at least one later pattern has a linear shape oriented in the sharp angle α.

* * * * *